United States Patent [19]

Recine, Sr.

[11] Patent Number: 5,171,372

[45] Date of Patent: Dec. 15, 1992

[54] THERMOELECTRIC COOLER AND FABRICATION METHOD

[75] Inventor: Leonard J. Recine, Sr., Plano, Tex.

[73] Assignee: Marlow Industries, Inc., Dallas, Tex.

[21] Appl. No.: 694,921

[22] Filed: May 2, 1991

Related U.S. Application Data

[62] Division of Ser. No. 583,157, Sep. 17, 1990, Pat. No. 5,064,476.

[51] Int. Cl.⁵ .............................................. H01L 35/28
[52] U.S. Cl. ..................................... 136/203; 136/204; 136/224; 136/212
[58] Field of Search ............... 136/200, 203, 204, 224, 136/225, 212

[56] References Cited

U.S. PATENT DOCUMENTS

| | | | |
|---|---|---|---|
| 2,844,638 | 7/1958 | Lindenblad | 136/4 |
| 3,022,360 | 2/1962 | Pietsch | 136/4 |
| 3,083,248 | 3/1963 | Schumacher | 136/4 |
| 3,247,577 | 4/1966 | Jaremus et al. | 29/155.5 |
| 3,269,871 | 8/1966 | Kilp et al. | 136/203 |
| 4,465,895 | 8/1984 | Verner et al. | 136/225 |
| 5,006,505 | 4/1991 | Skertic | 505/1 |

Primary Examiner—Brooks H. Hunt
Assistant Examiner—Chrisman D. Carroll

[57] ABSTRACT

A thermoelectric device has hot and cold sides. The hot and cold sides include a plate of insulation material having "peanut" or rectangularly shaped tabs forming hot and cold side tab patterns. The tabs have circular or polygonal shaped pockets adjacent opposing ends of the tabs. Legs of p-type and n-type semiconductor material are attached in opposing end pockets of the tabs. Spade connectors are attached to end tabs of the cold side plate for connection to a dc source of power. The legs are vibrated into the pockets of one side (either the hot or cold side) and the tabs of the other side are positioned to opposing ends of the tabs of the other side (either the cold or hot side).

3 Claims, 5 Drawing Sheets

THERMOELECTRIC COOLER AND FABRICATION METHOD

This is a division, of application Ser. No. 583,157, filed Sep. 17, 1990, now U.S. Pat. No. 5,064,476.

This invention relates to thermoelectric coolers and more particularly to a thermoelectric cooler having conductive type tabs and an improved method of manufacture.

BACKGROUND OF THE INVENTION

Thermoelectric coolers include a matrix of thermoelectric couples formed of n-type and p-type semiconductor material. The thermoelectric couples are connected electrically in series and thermally in parallel. The thermoelectric couples are sandwiched between two ceramic plates. The two ceramic plates define either the cold side or hot side depending on the connection of the dc voltage. With a positive dc voltage applied to the n-type thermoelement, electrons pass from the p- to the n-type thermoelement and the cold side temperature will decrease as heat is absorbed. Cooling is proportional to the current and the number of thermoelectric couples, and occurs when electrons pass from a low energy level in the p-type thermoelement to a higher energy level in the n-type thermoelement. The heat is then conducted through the thermoelement to the hot side, and liberated as the electrons return to a lower energy level in the p-type thermoelement. To keep the device working, it is necessary to remove the heat dissipated at the hot side. Thus, a heat sink is attached to the hot side for heat removal. The thermoelements are hereinafter referred to as "legs".

Prior thermoelectric coolers have been fabricated using flat conductive tabs stamped from strips of conductive metal preferably copper. Each tab has a size sufficient to receive ends of a pair of legs in a spaced relationship.

The tabs are placed in a grid type mold by placing the tabs on the grid and brushing the grid in a manner to orient the tabs for grid acceptance. A ceramic plate is then screen printed with a solder paste. The grid with tabs is then pressed against the solder paste portions of the plate. The tabs stick to the ceramic plate and the grid removed. The tabbed ceramic plate is then placed in a furnace to reflow the solder to substantially permanently attach the tabs to the ceramic plate. Two grids are used. A first type grid contains the hot side pattern and the second type grid contains the cold side pattern. A solder flux is then applied to the tabs of the tabbed ceramics. A leg matrix mold is then filled with legs by vibrating the legs into the mold. The filled mold is then aligned with the solders fluxed tabs of a first one (either the hot or cold side) of the tab patterned ceramics and pressed into the solders flux. The leg matrix mold is then removed and the legs permanently attached to the tabs by reflowing the solder. To complete the thermoelectric couple the opposing ends of the legs are similarly attached to the patterned tabs of a second one (either cold or hot as appropriate) of the tab bearing ceramics.

A problem with the existing thermoelectric cooler is its cost. The complexity of the elements for the component parts of the thermoelectric cooler dictates that considerable manual labor be expended in the process for assembling the elements for machine combination into components, and assembling the components for machine combination into thermoelectric coolers.

SUMMARY OF THE INVENTION

Accordingly it is an object of the invention to provide an improved thermoelectric cooler and an improved method of manufacture for reducing substantially the cost of the thermoelectric cooler and increasing its applications.

Another object of the invention is to improve the provisioning of insulating plates with conductive tabs.

Yet another object of the invention is to improve tab construction for facilitating leg attachment.

Still another object of the invention is to improve tab configuration and placement on the insulating plates for minimizing the size of the insulating plates.

Briefly stated, the invention in a first embodiment includes attaching a high temperature adhesive tape to a side of a corresponding strip of conductive material opposite a solder bearing side. A pattern of tabs is stamped from the conductive strip onto the adhesive tape. Next, a plate of insulating material is stuck to the solder bearing sides of the tabs and the solder reflowed to attach substantially permanently the tabs to the insulating plate. After soldering the conductive strip to the insulating plate, the adhesive tape is stripped from the conductive strip. Then, the process is repeated to form a second pattern of tabs on a second insulating plate. In this manner the insulating plates are patterned with tabs for a hot side and a cold side for the thermoelectric element. The thermoelectric element is completed by soldering hot side and cold side patterned tabs to legs in the typical manner.

In a second embodiment of the invention, a strip of conductive material having the solder layers is blanked to form the desired first pattern of tabs in the strip. The blanked tabs of the conductive strip are then stuck to a first insulating plate and the solder reflowed to attach the tabs of the blanked strip of conductive material to the insulation plate. After which, the remainder of the conductive strip is stripped from the tabs. The process is repeated to form the desired second pattern of tabs on a second insulating plate. The thermoelectric element is completed by attaching opposing ends of the legs to the patterned tabs of the hot side and cold side insulation plates by reflowing the solders of the tabs.

In either the first or second embodiment, the tabs of the conductive strip can be provided with pockets for receiving the legs. The forming of the pockets in the tabs, by stamping, wedges the tabs in the conductive strip. Thus, in either embodiment the need for high temperature adhesive tape is eliminated. The pockets are shaped either to correspond to the shape of the legs, or are circular to receive either circular or sided legs of the thermoelectric elements. For circular pockets, the tabs may be Lemniscate of Bernoulli shaped. The Lemniscate or Bernoulli shaped tabs are hereafter referred to as "peanut" shaped.

BRIEF DESCRIPTION OF THE DRAWINGS

Other objects and features of the invention will become more readily apparent from the following detailed description when read in conjunction with the accompanying drawings, in which.

DETAILED DESCRIPTION OF PREFERRED EMBODIMENTS

Figure 1:
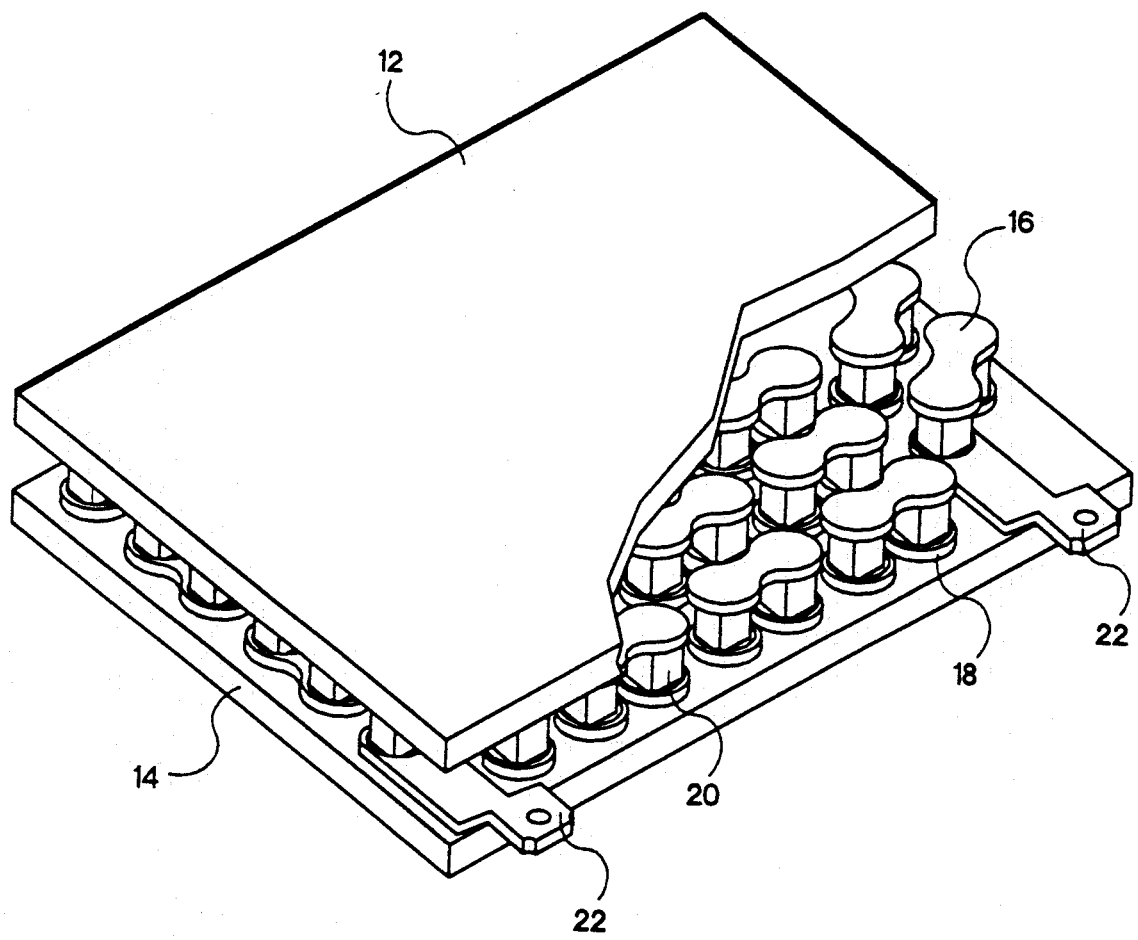
FIG. 1 is an isometric view of a thermoelectric cooler embodiment of the present invention.
Figure 2:
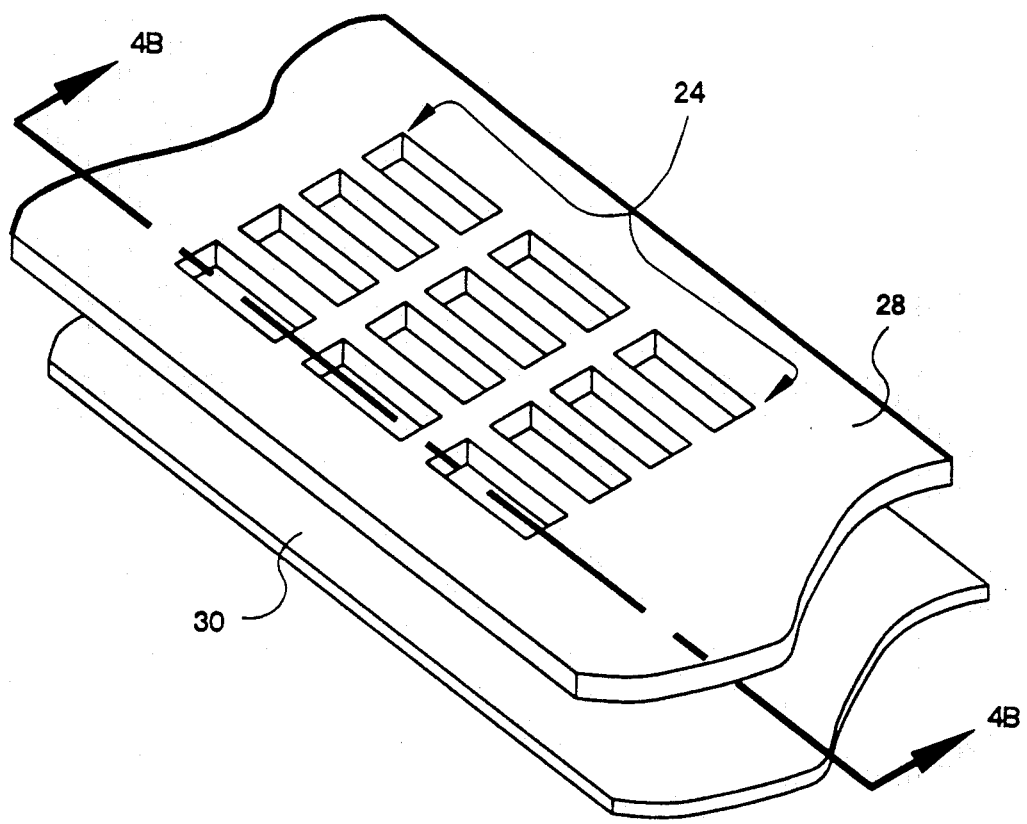
FIGS. 2 and 3 are partial isometric views of the strips including hot and cold side tab array patterns in accordance with a first embodiment of the invention.
Figure 3:
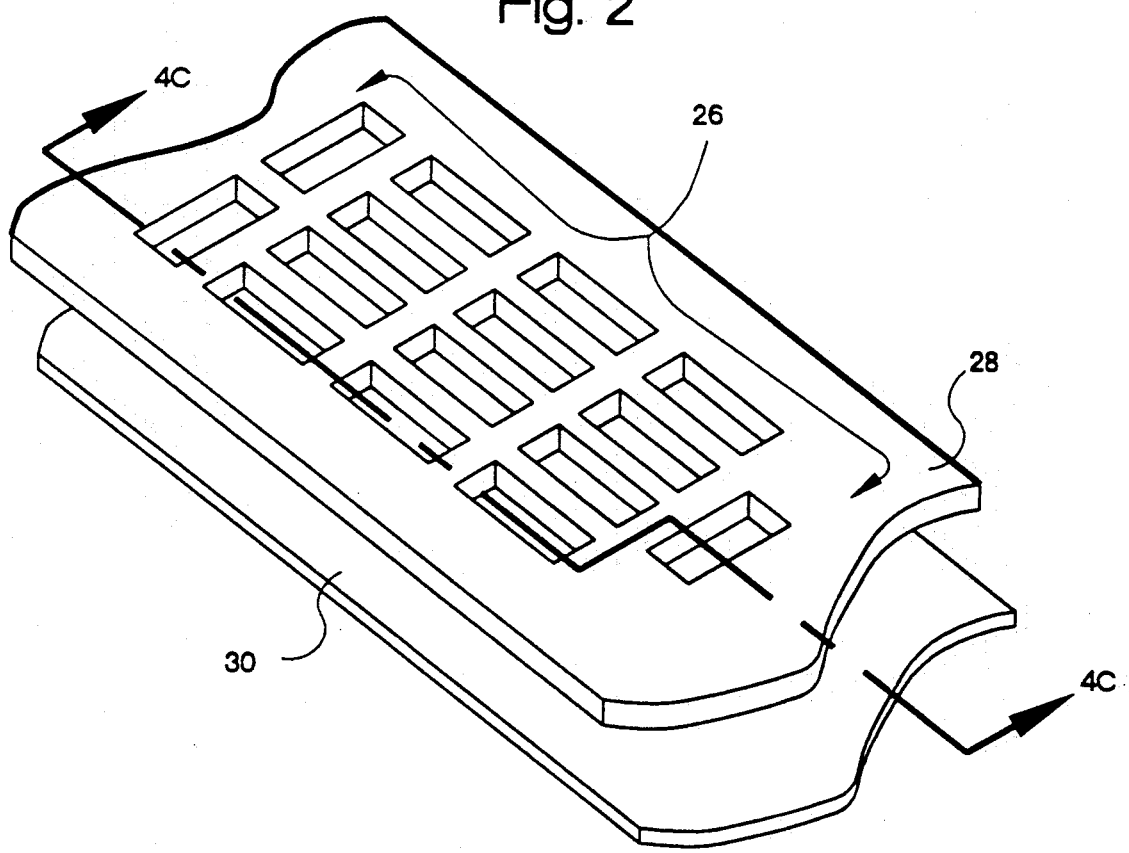

Referring now to FIG. 1, the thermoelectric cooler 10 includes insulating plates 12 and 14. Plates 12 and 14 are typically ceramic plates. Peanut shaped conductive tabs 16 are attached to or formed on plates 12 and 14 by stamping or blanking or by thick film printing techniques, or other photolithographic techniques. The conductive tabs 16 are arranged on plate 12 in a pattern for a hot side plate (FIG. 2) and on plate 14 in a pattern for a cold side plate (FIG. 3). The tabs 16 as shown in FIG. 1 have pockets 18 formed in end portions for legs 20. Other tab configurations will be described hereinafter. The legs 20, which are alternately of n-type and p-type semiconductor material, are soldered to the hot plate side and the cold side plate. Spade connectors 22 are attached to corner tabs 16 on one side of the cold side plate 14 for connecting a dc source of power (not shown) to the thermoelectric unit.

The difference between cold side and hot side patterns 24 and 26 (FIGS. 2 and 3) is that the hot side includes end tabs disposed normal to the intermediate tabs for connecting the rows of legs in series in a serpentine manner. It will be appreciated that the patterns shown have been abbreviated for purposes of description and in practice may have any number of rows and columns of tabs. The number of tabs selected is to demonstrate only how the rows and columns are connected to the legs.

Figure 4A:
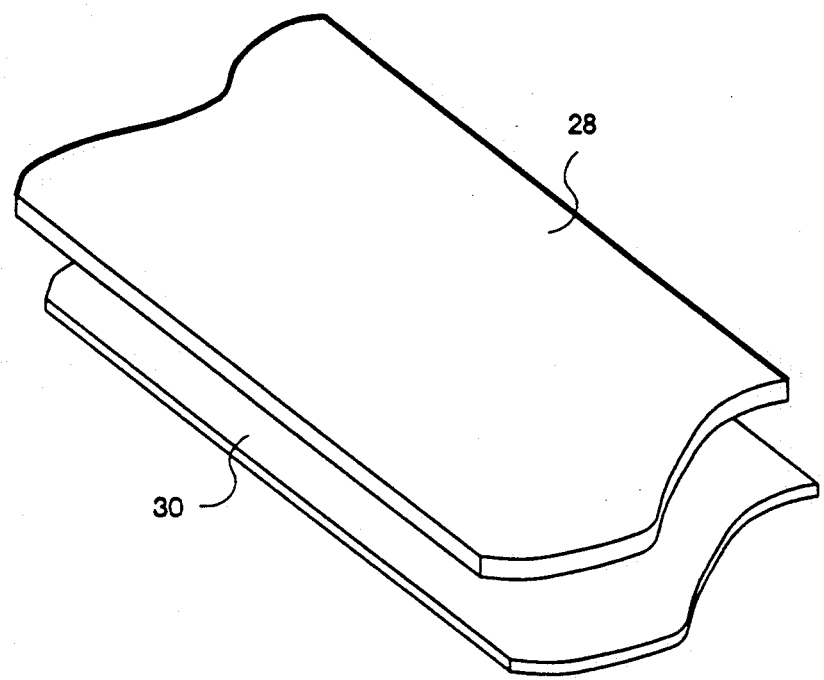
FIG. 4a is an exploded partial isometric view of the conductive strip and associated adhesive tape for tab array fabrication.
Figure 4B:
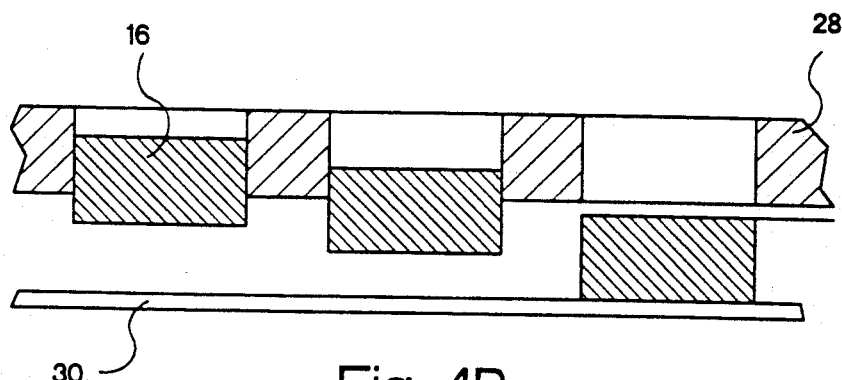
FIG. 4b is a partial cross-sectional view taken along line 4b—4c showing the fabrication of the rectangular pattern for the hot side tab array of a first embodiment of the invention.
Figure 4C:
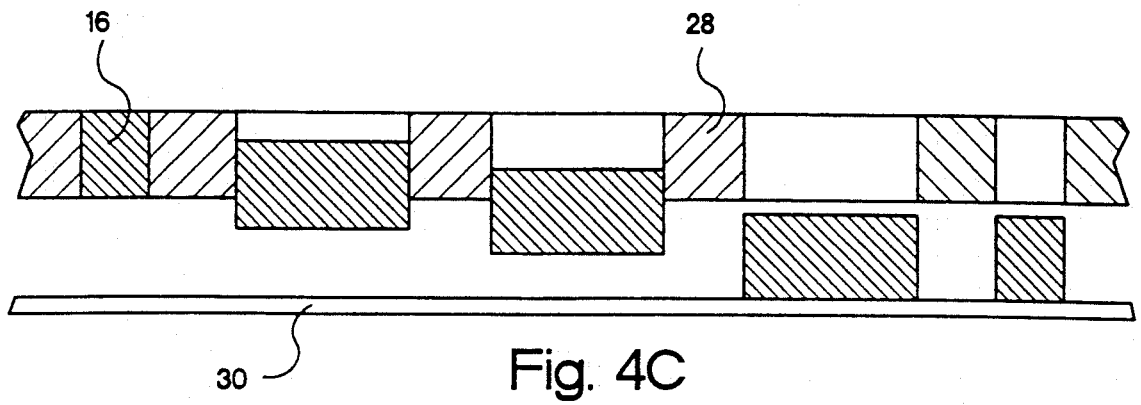
FIG. 4c is an exploded partial cross-sectional view taken along line 4c—4c of FIG. 3 showing the fabrication of the rectangular pattern for the cold side tab array of a first embodiment of the invention.
Figure 5:
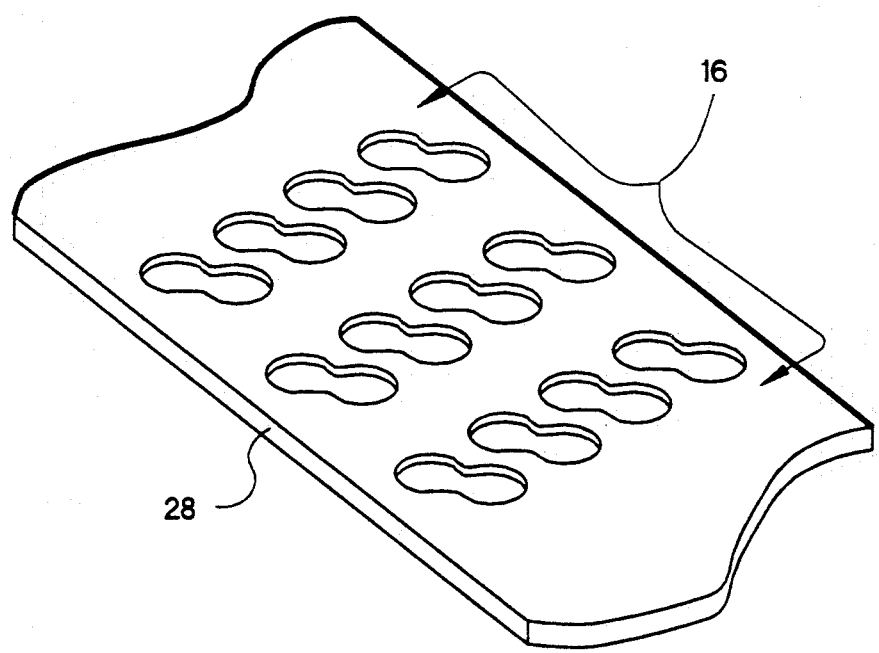
FIG. 5 is an isometric view of a variation of the tab shape of the arrays of FIGS. 2 and 3 of the first embodiment.
Figure 6:
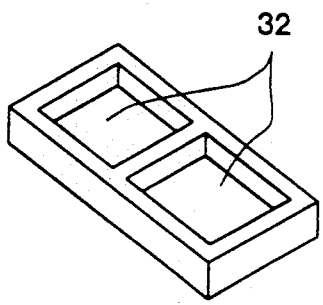
FIGS. 6 and 7 are isometric views of the pocketed tabs of strips of FIGS. 5, 2, and 3 including blanked and coined pocket tabs.
Figure 7:
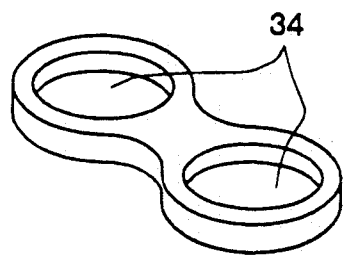

In a first embodiment, the tab patterns are made as follows. A strip of tab material 28 (FIG. 4a) which is, for example, a Ni-SnPb plated copper strip, is stuck to the adhesive side of a high temperature adhesive tape 30. A suitable tape is sold by the 3M Company under the trade mark KAPTON. Dies (not shown) having the cold side and hot side tab patterns formed thereon are struck against the strip as it passes by to stamp the side pattern tabs out of the strip onto the adhesive tape (FIGS. 4b and 4c). Each plate stamping can be made using a single strike or preferably by three strikes of the die to complete the tab stamping operation. In this manner a plurality of cold and hot side tab arrays are formed on the tape. The die tabs are contoured to form either rectangularly shaped (FIGS. 2 and 3) or Lemniscate of Bernoulli (peanut) shaped tabs (FIGS. 1 and 5), with or without pockets. Polygon (square) shaped pockets 32 (FIG. 6) or circular shaped pockets 34 (FIG. 7) are provided. The tab pockets are for receiving the legs. After stamping the cold and hot side patterns the remaining tab frames are removed thereby leaving the tabs 16 stuck to the adhesive tape. The array of peanut shaped tabs form an oblique pattern as shown in FIG. 5 whereby heads of the tabs are positioned adjacent to neck portions of successive tabs to minimize the size of the insulating plates to which they are attached.

Figure 8:
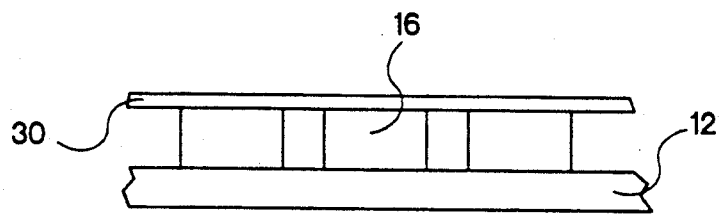
FIG. 8 is a partial cross sectional view of the hot side pattern positioned on an insulation plate for attachment.

Next, the array of tabs forming either the hot side pattern 24 (FIG. 2) or the cold side pattern (FIG. 3) is positioned on an insulating plate 12 or 14. FIG. 8 shows in cross section the hot side pattern, which is stuck to the adhesive tape 30, positioned by pressing the solders side of the solder plated tabs onto an insulation plate 12 (FIG. 4d). Then the structure is placed in a furnace for reflowing the SnPb layer to solder the tabs to the plate. After reflow, the high temperature adhesive tape 30 is removed to complete the hot and cold side plates.

Figure 9A:
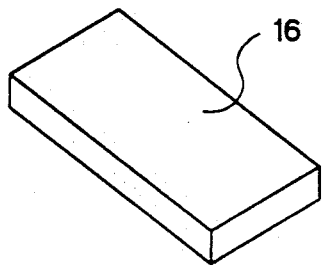
FIGS. 9a and 9b are isometric views of tabs of FIGS. 5, 2 and 3.
Figure 9B:
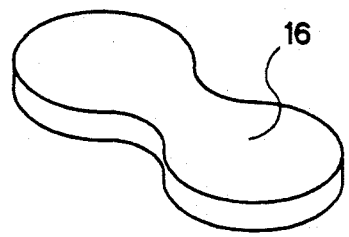

After making the hot and cold side plates, opposing ends of legs 20 are fitted to the tabs. For tabs without pockets (FIGS. 9a and 9b), the legs are attached by vibrating the legs into a frame mold not shown in the typical manner. If the frame can be retained, the frame is then positioned in a furnace with the ends of the legs in contact with the tabs of the tabbed insulation plates 12, 14 (FIG. 1) for attachment to the tabs of the plates using the solder reflow technique. Else the loaded frame with one side 12 or 14 fitted thereto is placed in a furnace for reflowing the solder to attach the legs to the side. Then the frame is removed and the other plate 14 or 12 fitted to the opposite ends of the legs and returned to the furnace for reflowing the solder to attach the second plate.

Figure 10:
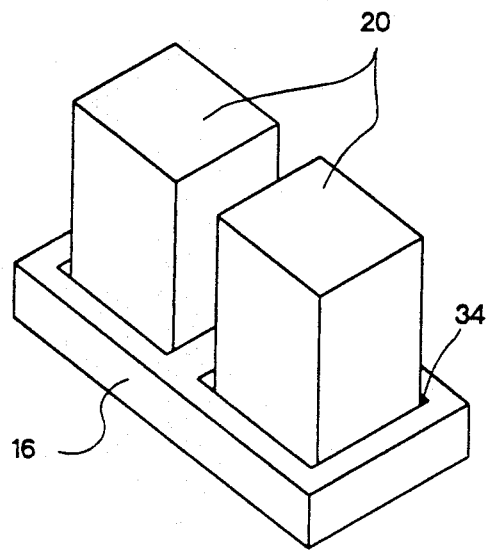
FIGS. 10 and 11 are views showing, respectively, the pocket tabs of FIGS. 9a and 9b with legs of the thermoelectric element attached.
Figure 11:
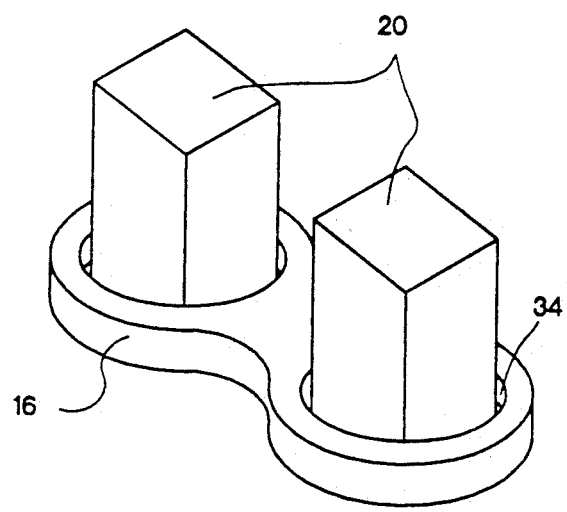

For tabs with pockets 32, 34 (FIGS. 10 and 11), the use of the frame is not required. The legs 20 are vibrated into the pockets 32, 34 of either the hot or cold plate tabs 16 and the pockets of either the cold or hot side plate tabs 16, as appropriate, fitted thereto for attachment by reflowing the solder on the tabs. It will be appreciated by those skilled in the art that use of circular pockets 34 (FIG. 11) is preferred as it alleviates the need to orient the legs and the pockets during vibration; thus, reducing substantially the time required to fill the pockets. Further, those skilled in the art will recognize that the peanut shaped tab is preferred over the rectangular shaped tab as it provides: increased copper area for better heat transfer; increased shear strength for the tab; and increased solder area for improved solderability.

Figure 12:
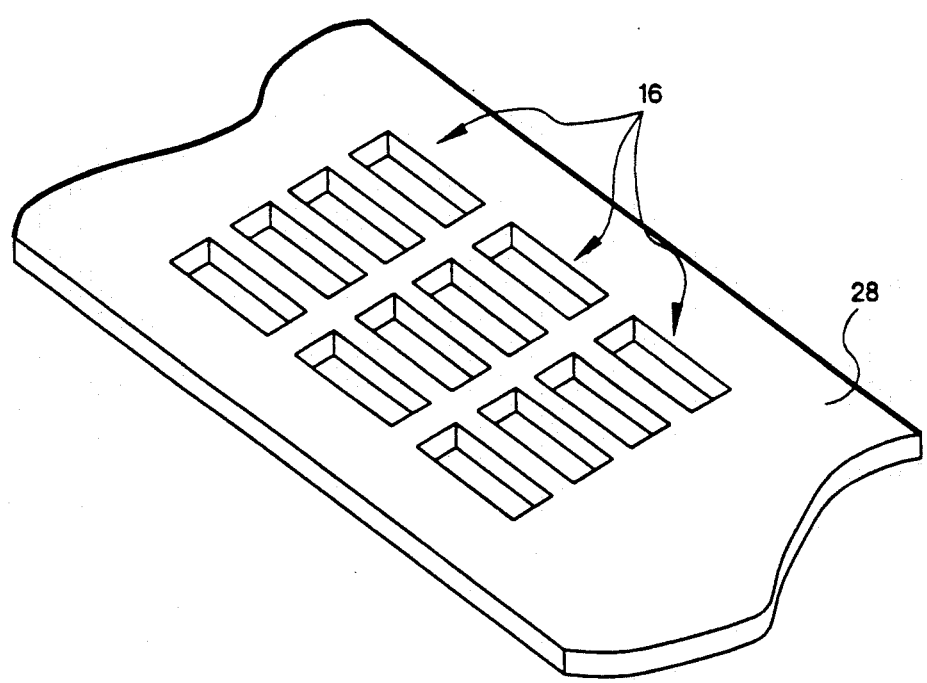
FIG. 12 is an isometric view of a second embodiment of the tab fabrication for the invention.

In a second embodiment (FIG. 12) a blanking operation replaces the stamping operation. Thus, the high temperature adhesive tape is not required for the solder layered strip of conductive material 28. The tab solder layered strip of conductive material is struck with the tab patterned die sufficient only to blank the tabs of the tab pattern in the strip. In this manner the cold and hot side patterned strips are formed. Then a first blanked strip, which may be either a hot or cold side patterned strip, is positioned over the insulation plate 12 or 14 and attached thereto using the solder reflow technique. Next, the frame portion of the conductive strip 28 is removed to form the first tabbed insulation plate. The process is repeated to form the corresponding cold or hot side plate. After the hot and cold sides are made, the legs are attached as described above in connection with the first embodiment.

Although several embodiments of the invention have been described, it will be apparent to a person skilled in the art that various modifications to the details of construction shown and described may be made without departing from the scope of this invention.

What is claimed is:

1. A thermoelectric device comprising:
   first and second plates of insulating material;
   first and second arrays of peanut shaped tabs attached to the first and second plates of insulating material, said first and second array of tabs being formed in preselected oblique patterns for positioning heads of the peanut shaped tabs adjacent to neck portions of successive peanut shaped tabs for minimizing the size of the first and second plates of insulating material; and
   a plurality of legs of n- and p- type semiconductor material selectively connected to the tab heads of the first and second arrays of peanut shaped tabs to form a plurality of thermocouples for the thermoelectric device.

2. A thermoelectric device according to claim 1 wherein the first and second arrays of peanut shaped tabs further include circular pockets adapted for receiving the plurality of legs without orientation of the individual legs.

3. A thermoelectric device according to claim 1 wherein the first and second arrays of peanut shaped tabs further include polygon shaped pockets adapted for receiving the plurality of legs without orientation of the individual legs.

* * * * *